(12) United States Patent
Okazaki

(10) Patent No.: US 6,777,613 B2
(45) Date of Patent: Aug. 17, 2004

(54) MULTIFUNCTIONAL CRYSTAL UNIT AND METHOD OF MANUFACTURING THE SAME

(75) Inventor: Masanobu Okazaki, Saitama (JP)

(73) Assignee: Nihon Dempa Kogyo Co., Ltd, Tokyo (JP)

(*) Notice: Subject to any disclaimer, the term of this patent is extended or adjusted under 35 U.S.C. 154(b) by 0 days.

(21) Appl. No.: 10/228,616

(22) Filed: Aug. 27, 2002

(65) Prior Publication Data

US 2003/0045181 A1 Mar. 6, 2003

(30) Foreign Application Priority Data

Aug. 28, 2001 (JP) .......................................... 2001-257294
Aug. 31, 2001 (JP) .......................................... 2001-263948

(51) Int. Cl.[7] .................................................. H05K 9/00
(52) U.S. Cl. ........................ 174/52.4; 174/35 R; 331/67
(58) Field of Search ............................... 174/524, 35 R, 174/35 MS, 356 C; 331/67, 68, 816, 818

(56) References Cited

U.S. PATENT DOCUMENTS 4,035,673 A * 7/1977 Ishida et al. ................. 310/344
5,539,148 A * 7/1996 Konishi et al. ............. 174/35 R
5,597,979 A * 1/1997 Courtney et al. .......... 174/35 R
6,448,583 B1 * 9/2002 Yoneda et al. ................ 257/81
6,462,960 B1 * 10/2002 Watanabe ..................... 361/816

FOREIGN PATENT DOCUMENTS

JP          2000-349181          12/2000

* cited by examiner

Primary Examiner—Dean A. Reichard
Assistant Examiner—Carmelo Oliva
(74) Attorney, Agent, or Firm—Katten Muchin Zavis Rosenman

(57) ABSTRACT

A multifunctional crystal unit in which in the same container constituted by a container body having a recess therein and a cover, a plurality of crystal blanks are hermetically encapsulated. In the container, the crystal blanks are respectively held in different spaces, which are isolated from one another by a shielding member. Hereby, respective crystal blanks are electrically shielded from one another. As the plurality of crystal blanks, a crystal blank of AT cut for generating a communication frequency signal, and a tuning fork type crystal blank for generating a clock signal are preferably used.

22 Claims, 7 Drawing Sheets

MULTIFUNCTIONAL CRYSTAL UNIT AND METHOD OF MANUFACTURING THE SAME

BACKGROUND OF THE INVENTION

1. Field of the Invention

The present invention relates to a multifunctional or multi-frequency quartz crystal unit in which a tuning fork type quartz crystal blank and a quartz crystal blank of thickness-shear mode are hermetically encapsulated in the single same container, and more particularly, relates to a multifunctional crystal unit using a crystal blank of AT cut as a thickness-shear mode crystal blank, and a method of manufacturing the same.

2. Description of the Background Arts

A quartz crystal unit is incorporated in an oscillator or an oscillating circuit as a reference source of frequency and time, and is accommodated in various kinds of electronic apparatuses. A number of such apparatuses accommodates different kinds of crystal units in response to the uses. For example, in small mobile electronic apparatuses including recent portable telephones, a thickness-shear mode crystal unit of AT cut, which generates communication frequency signals, and a tuning fork type crystal unit, which generates clock signals are separately accommodated. The separate accommodation of a plurality of crystal units inhibits the electronic apparatuses from being downsized, and accordingly for example, in Japanese Laid-open Patent Application No. 2000-349181 (JP 2000-349181A), there has been proposed that both of different kinds of crystal blanks are encapsulated in a common container or vessel for the miniaturization purpose.

An example of the conventional multifunctional crystal unit accommodating therein a plurality of crystal blanks of such different vibration modes is illustrated in FIGS. 1 and 2.

As illustrated in FIG. 1, the crystal unit houses two kinds of crystal blanks 2 and 3 in substantially rectangular parallelepiped container 1 for surface mounting. Container 1 is constructed of laminated ceramics to have a recess formed from its upper face, and as illustrated in FIG. 2, container 1 is formed, at four corners of its outer bottom face, with mounting electrodes 4a, 4b, 5a and 5b used for connection with external circuits. Mounting electrodes 4a, 4b, 5a and 5b are formed so as to be somewhat extended and to rise up on the side faces of container 1. In the recess of container 1, stepped portions are formed. On the upper face of container 1 along the periphery of the recess, for example, metallic ring 6 is mounted to which metallic cover 7 is bonded by seam welding, and hereby crystal blanks 2 and 3 are hermetically encapsulated in container 1.

As illustrated in FIG. 3A, crystal blank 2 is a tuning fork type crystal blank which is made of quartz crystal plate of X cut and has vibration mode of length-width-flexure mode, and consists of a fork base portion 8 and a pair of fork arms 9a and 9b. Respective fork arms 9a and 9b of a columnar shape have four faces in which electrically paired excitation electrodes 10 are provided. Further, on both end portions of fork base portion 8 are provided extending electrodes 11a and 11b, so that respective excitation electrodes are extended to extending electrodes 11a and 11b. Extending electrodes 11a and 11b are fixedly bonded by conductive adhesive 12 to a pair of terminal electrodes (not illustrated) formed in the bottom face of the recess of container 1 so as to provide therebetween electrical and mechanical connection. Thus, tuning fork type crystal blank 2 is held within the recess of container 1, so that the plate face thereof is directed vertically. The pair of terminal electrodes to which tuning fork type crystal blank 2 is connected, are electrically connected to the above-described mounting electrodes 5a and 5b through conductive patterns and via-holes formed in the inner face of container 1.

On the other hand, crystal blank 3 of AT cut is a planar plate like crystal blank acquired by being cut out of a quartz crystal by means of AT cut, and has both principal planes in which paired excitation electrodes 13 are formed. Further, crystal blank 3 formed in a rectangular shape has one side formed, at its opposite ends, with a pair of extending electrodes 14a and 14b to which the pair of excitation electrodes 13 are extended, respectively.

In the stepped portion of the recess of container 1 are formed a pair of terminal electrodes (not illustrated) to which extending electrodes 14a and 14b are fixedly bonded by means of conductive adhesive 12 to establish electrical and mechanical connection between the electrodes. Thus, crystal blank 3 of AT cut is held within the recess of container 1 in a manner such that the plate face is directed in a vertical direction. Crystal blank 3 of AT cut is disposed above tuning fork type crystal blank 2. The pair of terminal electrodes to which crystal blank 3 of AT cut is connected are electrically connected to the above-described mounting electrodes 4a and 4b, respectively, through conductive patterns and via-holes formed in the inner face of container 1.

In the described multifunctional crystal unit, tuning fork type crystal blank 2 vibrates at dozen kiloheltz to generate a reference frequency signal for clock use, while crystal blank 3 of AT cut vibrates at several through dozen megaheltz for generating communication frequency in a communication apparatus. For example, when this crystal unit is employed for a cellular telephone, the crystal unit is mounted on a printed wiring board of the cellular telephone, so that mounting electrodes 5a and 5b are connected to an oscillating circuit for clock signal, and mounting electrodes 4a and 4b are connected to an oscillating circuit for communication frequency use. Thus, tuning fork type crystal blank 2 is used as a crystal unit operating at a kilohertz band, while crystal blank 3 of AT cut is used as a crystal unit operating at a megaheltz band.

As described above, when different kinds of crystal blanks are housed in the same container for the surface mount use to be used as two kinds of crystal units, the size of the whole crystal unit can be kept small. Therefore, when this type of multifunctional crystal unit is employed, it is possible to miniaturize electronic apparatuses such as cellular telephones.

In the multifunctional crystal unit of the above-described constitution, when tuning fork type crystal blank 2 and crystal blank 3 of AT cut are respectively mounted to be held in the recess bottom and the stepped portion of container 1, the respective vibration frequencies must be adjusted. Namely, after when conductive adhesive 12 is thermally hardened to fixedly bond tuning fork type crystal blank 2 to the bottom portion of the recess, either the tip ends of fork arms 9a and 9b are cut off, for example, by machining, or metallic films provided at the tip ends of tuning fork arms 9a and 9b are removed away by, for example, laser processing, to adjust the vibration frequency. Then, after the adjustment of tuning fork type crystal blank 2, crystal blank 3 of AT cut is held at the stepped portion by means of conductive adhesive 12, and for example, ion beam is radiated to excitation electrodes 13 of crystal blank 3 so as to reduce film thickness of excitation electrodes 13 thereby adjusting the vibration frequency thereof. After the completion of the adjustment of the vibration frequencies, the common metallic cover 7 is attached so as to close the recess, and the manufacture of the crystal unit is completed.

In the described crystal unit, during the adjustment of the vibration frequency of crystal blank 3 of AT cut, metallic dusts scatting from excitation electrodes 13 might attach to tuning fork type crystal blank 2 to cause a problem such as, for example, a change in the vibration frequency and the short-circuiting between excitation electrodes 10 of tuning fork type crystal blank 2, resulting in an occurrence of defective. Although it might be possible to adopt an alternate way such that the crystal blank of AT cut is placed in the bottom portion of the recess, and the tuning fork type crystal blank is held at the stepped portion, an occurrence of defective due to similar generation of metallic dusts might not be avoided.

Furthermore, since tuning fork type crystal blank 2 and crystal blank 3 of AT cut are housed within the same container, these crystal blanks 2 and 3 are simultaneously driven to obtain both clock signals and communication frequency signals, and as a result problems set forth below might occur: Since respective crystal blanks (crystal units) 2 and 3 form oscillation closed loops together with the associated oscillating circuits, respectively, high frequency currents must flow from the oscillating circuits, and such high frequency currents from the respective oscillating circuits further flow through crystal blanks 2 and 3, and the circuit patterns including their connected mounting electrodes 4a, 4b, 5a and 5b. Therefore, electromagnetic wave leaks out of respective crystal blanks 2 and 3 as well as the circuit patterns to jump into the associated ones to thereby cause mutual interference. As a result, a problem occurs such that the oscillating operation is made unstable. For example, when crystal unit of AT cut generates a communication frequency $f_0$ (for example, 12 MHz), and when tuning fork type crystal unit generates a clock signal (at, for example, 32 kHz), a component of the clock signal is superposed onto the signal of communication frequency, and as a result, phase noise at $f_0 \pm 32$ kHz increases in the communication frequency signal.

In particular, mutual interference between excitation electrodes 10 and 13 of respective crystal blanks 2 and 3 having a large area, respectively, could become an unignorable problem. The more miniaturization of a surface mounting type crystal unit is promoted due to a reduction in the height as well as the planar face size of the crystal unit, the larger an adverse influence on the performance of the crystal unit due to the mutual interference will become.

SUMMARY OF THE INVENTION

An object of the present invention is to provide a multifunctional crystal unit provided therein with a tuning fork type crystal blank and a thickness-shear mode crystal blank and that is capable of ensuring the oscillating operation by preventing any electrical mutual interference between either the crystal blanks or other constituents.

Another object of the present invention is to provide a multifunctional crystal unit provided therein with a tuning fork type crystal blank and a thickness-shear mode crystal blank and that is improved in its productivity by preventing metallic dusts and the like from attaching to the crystal blanks during the adjustment of vibration frequency of the respective crystal blanks.

A further object of the present invention is to provide a method of manufacturing a multifunctional crystal unit provided therein with a tuning fork type crystal blank and a thickness-shear mode crystal blank, which method can be one capable of improving the productivity of the multifunctional crystal unit by preventing any metallic dusts from attaching to the crystal blanks during the adjustment of vibration frequency of the respective crystal blanks.

In accordance with a first aspect of the present invention, there is provided a multifunctional crystal unit in which a plurality of crystal blanks are hermetically encapsulated in the same container provided with a container body having a recess formed therein, and a cover, wherein the crystal unit is characterized in that respective of the crystal blanks are held in different spaces, and the different spaces are isolated from each other by a shielding member to thereby provide electrical shielding between the crystal blanks.

In accordance with a second aspect of the present invention, there is provided a multifunctional crystal unit in which first and second crystal blanks are housed in a closed container provided with a container body and a cover, wherein the crystal unit is characterized in that the container body has a cross-section of a H-letter shape and recesses formed in both primary planes thereof, while encapsulating in one recess the first crystal blank, and in the other recess the second crystal blank so that the respective recesses are sealed, respectively, by the connection of a cover, either one of the recesses having, at an end face thereof, mounting electrodes.

In accordance with a third aspect of the present invention, there is provided a method of manufacturing a crystal unit, which comprises providing a container body having a cross section thereof in the shape of a H-letter, recesses formed in both primary planes thereof; and mounting electrodes arranged in an end face of either one of the recesses, encapsulating a first crystal blank in one recess in the both primary planes and a second crystal blank in the other recess, adjusting vibration frequencies of the first and second crystal blanks, and thereafter sealing the recesses in both primary planes of the container body with respective covers.

DETAILED DESCRIPTION OF THE INVENTION

Figure 1:
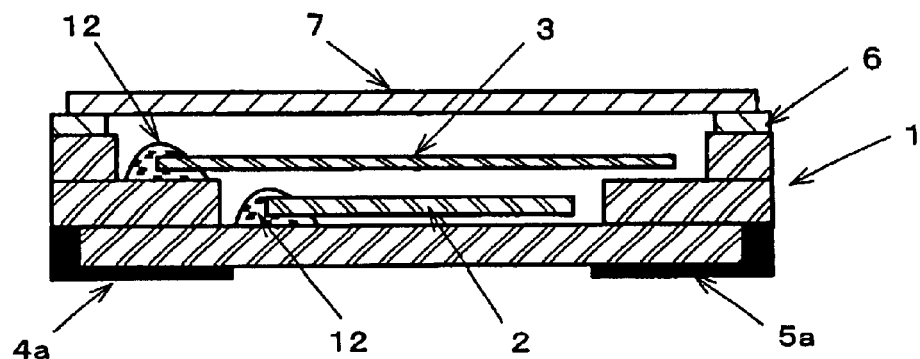
FIG. 1 is a cross-sectional view illustrating the construction of a conventional multifunctional crystal unit.
Figure 2:
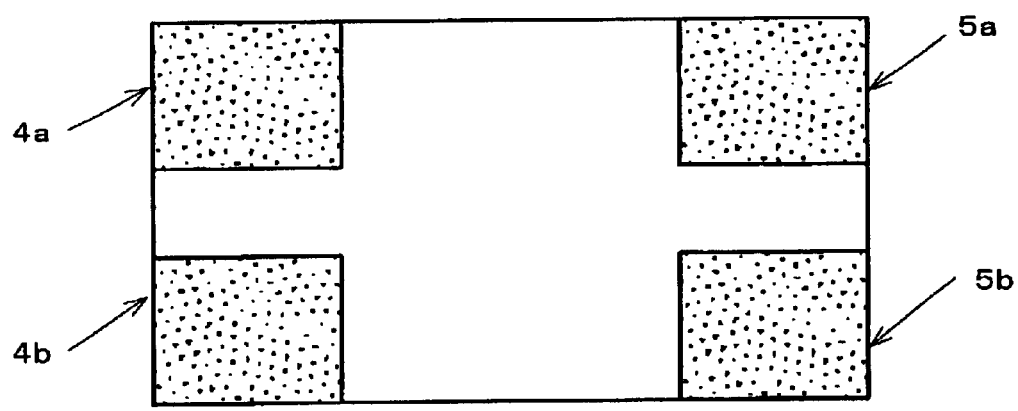
FIG. 2 is a bottom plan view of the crystal unit illustrated in FIG. 1.
Figure 4A:
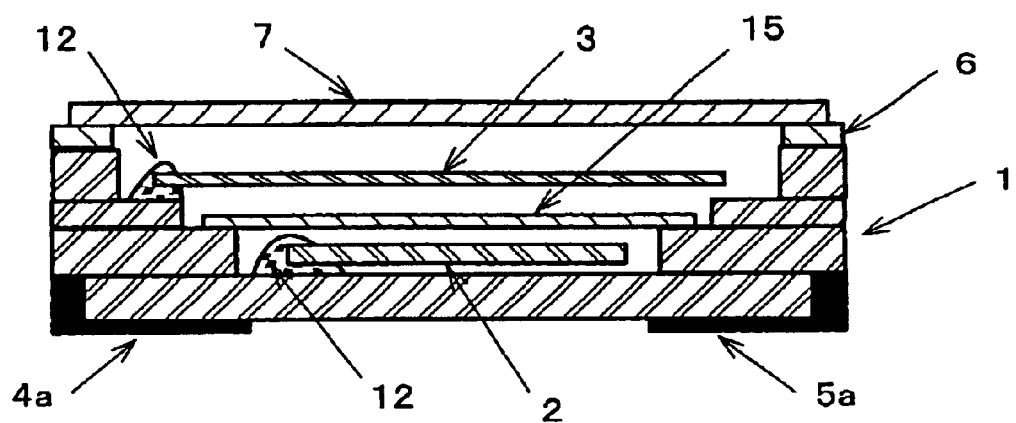
FIGS. 4A and 4B are cross-sectional and bottom plan views of a crystal unit according to a first embodiment of the present invention, respectively.
Figure 4B:
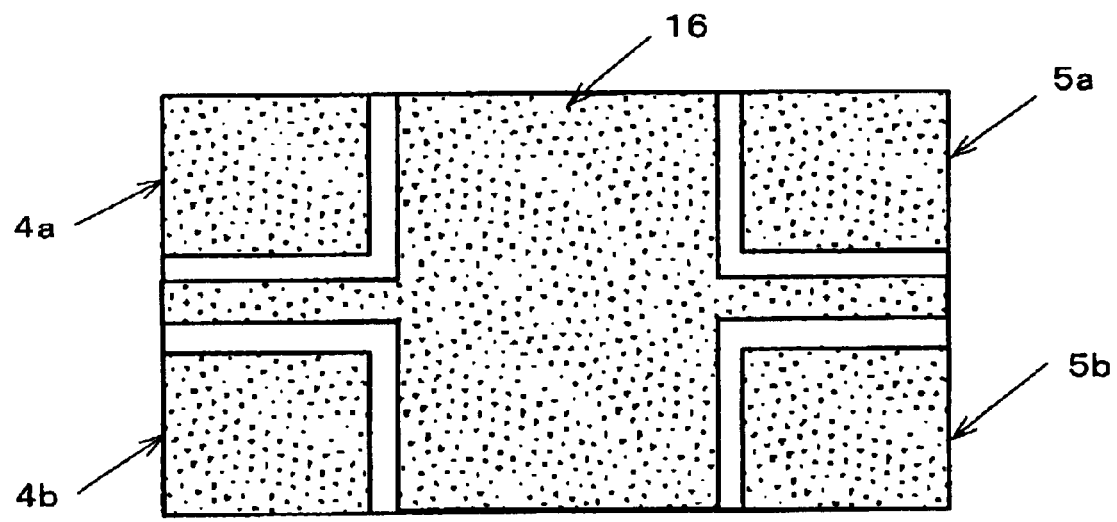

In FIGS. 4A and 4B illustrating a multifunctional crystal unit according to the first embodiment of the present invention, constituting elements and parts designated by the same reference numerals as those of FIGS. 1 and 2 are the same constituting elements and parts in FIGS. 1 and 2, and thus any more detailed description will not be repeated hereinbelow.

Figure 3A:
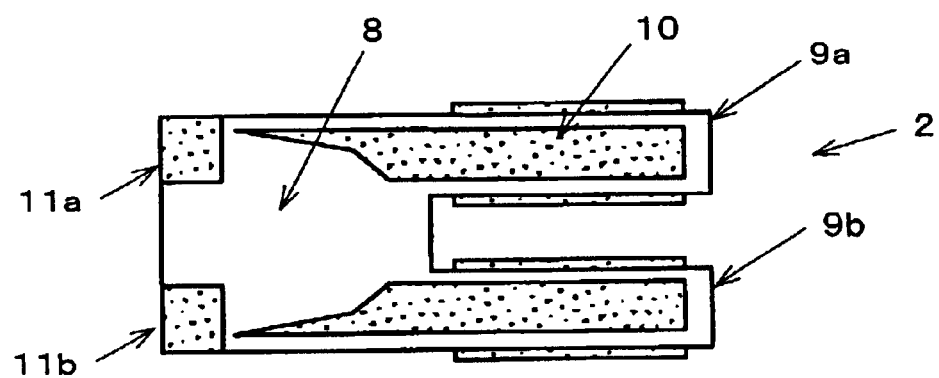
FIG. 3A is a plan view illustrating a tuning fork type crystal blank.
Figure 3B:
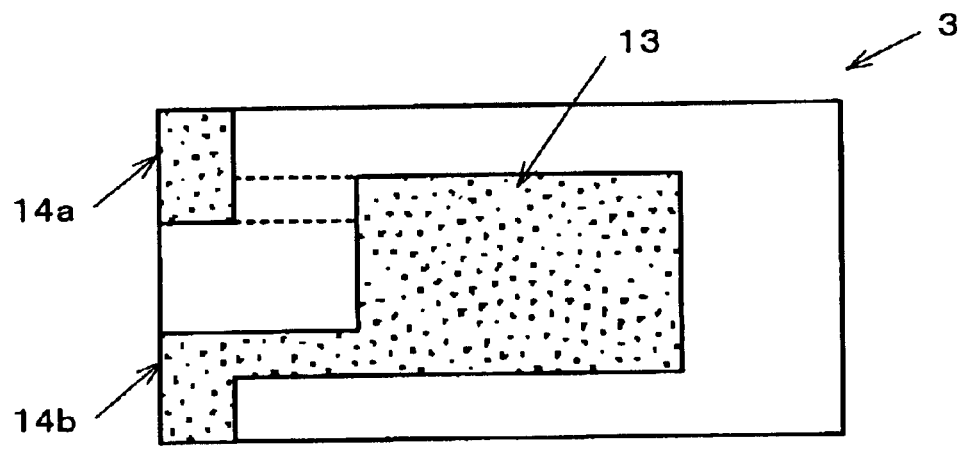
FIG. 3B is a plan view illustrating a crystal blank of AT cut.

The crystal unit according to the first embodiment encapsulates tuning fork type crystal blank 2 and crystal blank 3 of thickness-shear mode in container 1 constituted of laminated ceramics and having therein a recess, as described before, and specifically crystal blank 3 is a crystal blank of AT cut. As crystal blanks 2 and 3, those illustrated in FIGS. 3A and 3B are used.

In the recess of container 1, two stepped portions are formed.

Tuning fork type crystal blank 2, similarly to that illustrated in FIG. 1 is fixedly bonded to the bottom face of container 1 by conductive adhesive 12. This crystal blank 2 is connected to a pair of mounting electrodes 5a and 5b provided in the outer bottom face of container 1.

On the other hand, crystal blank 3 of AT cut, similarly to that illustrated in FIG. 1 has one side fixedly bonded, at its opposite ends, to the upper stepped portion by means of conductive adhesive 12. This crystal blank 3 is connected to a pair of mounting electrodes 4a and 4b provided in the outer bottom face of container 1.

Further, in this crystal unit, metallic plate 15 is arranged in the lower stepped portion in the recess of container 1 so as to separate between a space for containing therein tuning fork type crystal blank 2 and a space for containing therein crystal blank 3 of AT cut. Metallic plate 15 is arranged for providing an electrical shielding between particularly the excitation electrodes of crystal blank 2 and crystal blank 3. Therefore, the metallic plate is provided so as to close the space for containing the tuning fork type crystal blank 2 as completely as possible.

In the outer bottom face of container 1, other than mounting electrodes 4a, 4b, 5a and 5b, grounding electrode 16 is formed in a cruciate shape so as to electrically shield among these mounting electrodes. Metallic plate 15 arranged in the interior of container 1 is electrically connected to this grounding electrode 16 through non-illustrated via-holes. Also, metallic ring 6 is similarly electrically connected to grounding electrode 16 through conductive patterns provided in the sidewall of container 1. As a result, container 1 functions as a shielding container. The grounding electrode should preferably be connected, during mounting this multifunctional crystal unit onto a wiring board, to a grounded point or a grounded plane of the wiring board.

In accordance with the above-described constitution, since particularly excitation electrodes of tuning fork type crystal blank 2 and crystal blank 3 of AT cut are electrically shielded from one another by metallic plate 15, leakage of electromagnetic wave due to the high frequency current, in between the excitation electrodes of both crystal blanks can be prevented. Further, in the described embodiment, electric shielding is also provided between the mounting electrodes by means of grounding electrode 16, and thus leakage of any electromagnetic wave into the mounting electrodes can be again prevented. That is to say, any mutual interference between the crystal blank of AT cut and the tuning fork type crystal blank within container 1 can be prevented. For example, the phase noise due to the clock signal at the communication frequency signal is reduced so that the vibrations of both crystal blanks may be adequately maintained.

Metallic plate 15 is mounted on the lower stepped portion after completion of fixed bonding of tuning fork type crystal blank 2 as well as adjusting of its vibration frequency, and after the mounting of metallic plate 15, crystal blank 3 of AT cut is fixedly bonded to the upper stepped portion. Hereby, any metallic dusts, which might generate during execution of adjusting of the vibration frequency of crystal blank 3 of AT cut, can be blocked by metallic plate 15 to thereby be prevented from attaching to tuning fork type crystal blank 2. Accordingly, problems such as the electric short-circuiting between excitation electrodes 10 of tuning fork type crystal blank 2, and an occurrence of any change in the vibration frequency of the same crystal blank do not take place.

Figure 5A:
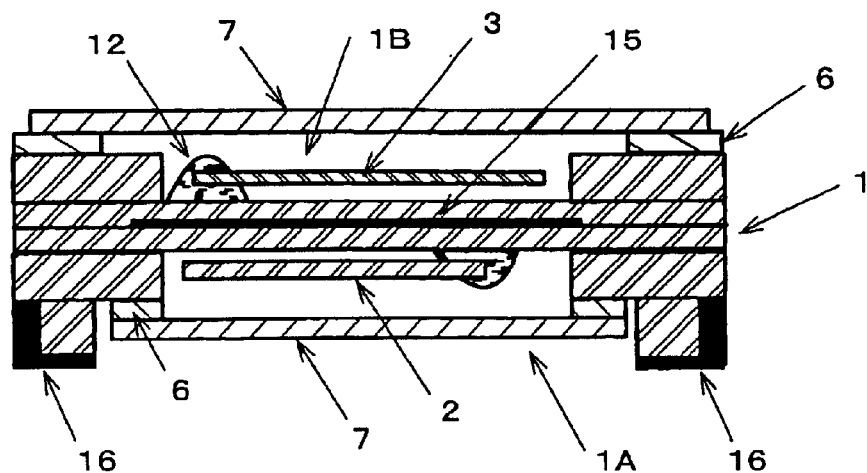
FIGS. 5A and 5B are cross-sectional and bottom plan views of a crystal unit according to a second embodiment of the present invention, respectively.
Figure 5B:
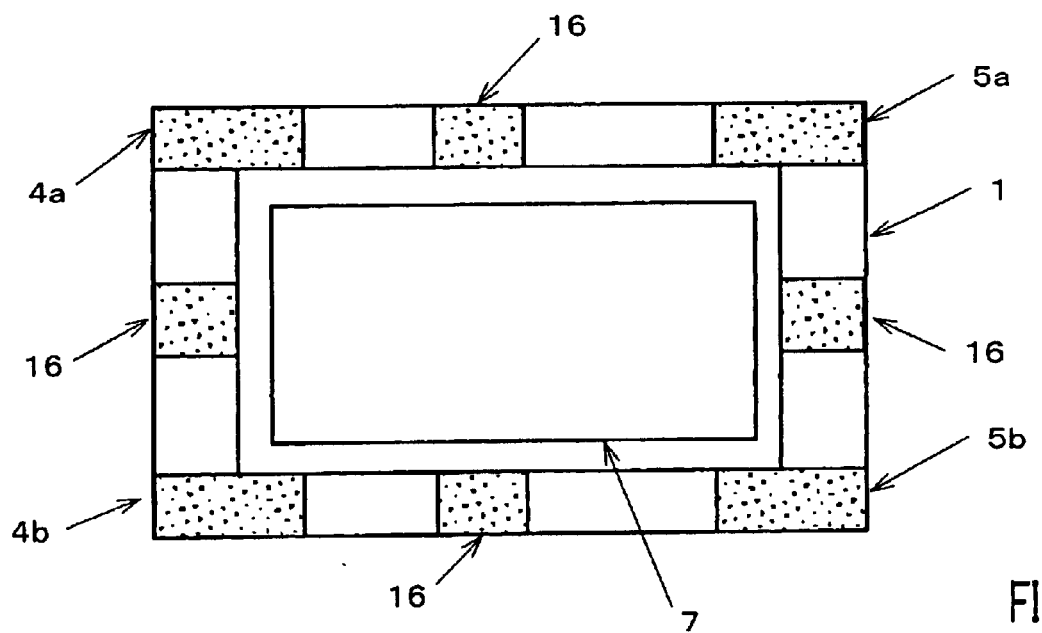

Next, a description of the crystal unit according to the second embodiment will be provided, with reference to FIGS. 5A and 5B. Here, substantially rectangular parallelepiped container 1 has two opposite faces in which recesses 1A and 1B are provided, respectively, and tuning fork type crystal blank 2 is housed in one recess 1A while crystal blank 3 of AT cut is housed in the other recess 1B. As crystal blanks 2 and 3, those which are illustrated respectively in FIGS. 3A and 3B are used. Container 1 is constituted of laminated ceramics, and due to the above-mentioned provision of recesses 1A and 1B, the cross-sectional shape thereof is formed in a substantially H-letter shape. Also, in a horizontal portion sectioning at the center of the H-letter shape, a metallic film formed by a metalized layer is provided as shielding layer 15.

In illustrated lower recess 1A, a stepped portion extending around the entire periphery of the recess is formed, and at four corner portions, mounting electrodes 4a, 4b, 5a and 5b are formed. Between two respective mounting electrodes, grounding electrode 16 is formed. Grounding electrodes 16 and shielding layer 15 are electrically connected through via-holes and the like formed in the sidewall of container 1. These mounting electrodes, the grounding electrodes, and the via-holes are formed integrally with container 1 during baking of ceramics for forming container 1.

Metallic ring 6 is bonded to the stepped portion of recess 1A by silver solder or the like. Also, another metallic ring 6 is bonded to the periphery of illustrated upper recess 1B by means of silver solder or the like.

In crystal blank 3 of AT cut, one side thereof is formed, at its opposite ends, with a pair of extending electrodes, which are fixedly bonded by conductive adhesive 12 to a pair of terminal electrodes (not illustrated) formed in the bottom face of recess 1B, so that crystal blank 3 is held within recess 1B. Similarly, tuning fork type crystal blank 2 is also fixedly bonded by conductive adhesive 12 in recess 1A so as to be held within such recess 1A. At this stage, conductive adhesive 12 is a thermosetting type adhesive, and such conductive adhesive 12 is applied to the positions of extending electrodes of tuning fork type crystal blank 2 and crystal blank 3 of AT cut so as to temporally bond these crystal blanks 2 and 3 to container 1. Thereafter, conductive adhesive 12 is simultaneously hardened by an oven, so that crystal blanks 2 and 3 are fixedly bonded.

Then, a beam from an ion gun is radiated toward the excitation electrodes of, for example, crystal blank 3 of AT cut housed in recess 1B in order to scrape the surface thereof off to thereby reduce the film thickness. Thus, the vibration frequency of this crystal blank 3 is adjusted from the low to a high frequency. Alternatively, by attaching a metallic thin film by sputtering, the vibration frequency of this crystal blank 3 is adjusted from a high to a low frequency. Subsequently, either ends of the fork arms of tuning fork type crystal blank 2 housed in recess 1A are machined or the metallic film provided on the ends of the fork arms is removed by scraping, so as to adjust the vibration frequency of this tuning fork type crystal blank 2. Of course, adjustment of the vibration frequency may be executed in an arbitrary order with regard to crystal blanks 2 and 3.

One metallic cover 7 is bonded by seam welding onto recess 1B, and the other metallic cover 7 is bonded by beam welding onto the stepped portion of recess 1A, so that crystal blanks 2 and 3 are sealed, respectively. Shielding layer 21 as well as metallic cover 7 on every primary plane are electrically connected to grounding electrodes 16 by means of the above-described via-holes and the like.

In accordance with the described constitution, container 1 has a cross section in the shape of H-letter, so that recesses 1A and 1B of both primary planes thereof separately encapsulate therein tuning fork type crystal blank 2 and thickness-shear mode crystal blank 3, respectively. Thus, respective crystal blanks 2 and 3 are isolated from one another up and down, i.e., vertically, by the horizontal portion of the H-letter shape. In other words, respective crystal blanks 2 and 3 are encapsulated in vertically different spaces so as to be separated from one another. The above-mentioned horizontal portion of the H-letter shape functions as a partition wall arranged between a first space defined so as to accommodate therein tuning fork type crystal blank 2 and a second space defined so as to accommodate therein crystal blank 3 of AT cut. Thus, when tuning fork type crystal blank 2 and crystal blank 3 of AT cut are respectively fixedly bonded to the bottom faces of the recesses 1A and 1B of both primary planes and when the adjustment of the vibration frequencies of both crystal blanks are executed, any metallic dusts which might be generated during the vibration frequency adjusting operation of any one crystal blank are prevented from attaching to the other crystal blank. In the described embodiment, during the adjustment of the vibration frequency of tuning fork type crystal blank 2, although metallic dusts for the adjustment might generate from the excitation electrodes, these metallic dusts can be prevented from attaching to tuning fork type crystal blank 2 fixedly bonded to recess 1A. Also, on the contrary of the above-described embodiment, when the vibration frequency adjustment of tuning fork type crystal blank 2 is preceded that of crystal blank 3, dusts which occur during the cutting of the crystal blank or metallic dusts due to the laser beam machining can be prevented from attaching to crystal blank 3 of AT cut.

In the above description, before sealing by being covered with metallic cover 7, adjustment of vibration frequencies of tuning fork type crystal blank 2 and crystal blank 3 of AT cut has been completed. However, for example, after completion of adjustment of the vibration frequency and the sealing of crystal blank 3 of AT cut, adjustment of the vibration frequency of tuning fork type crystal blank 2 may be executed. In this way, during the adjustment of the vibration frequency of tuning fork type crystal blank 2, attachment of metallic dusts or the like to crystal blank 3 of AT cut sealed by metallic cover 7 can be surely prevented.

Hereby, attachment of metallic dusts or the like during the adjustment of vibration frequencies of tuning fork type crystal blank 2 and crystal blank 3 of AT cut can be prevented, and thus the vibration characteristics of the crystal units can be prevented from being lowered by the cause of such metallic dusts or the like, and further an occurrence of any electrical short-circuiting among the excitation electrodes due to such metallic dusts and the like can be also cancelled so as to increase the productivity of the crystal unit.

In the described embodiment, between recesses 1A and 1B, namely, in the horizontal portion of the H-letter shape of container 1 having the H-letter shape cross section, shielding layer 15 is provided. Although this shielding layer 15 might be omitted, provision of such shielding layer 15 permits especially the excitation electrodes of tuning fork type crystal blank 2 and crystal blank 3 of AT cut to be electrically shielded therebetween. Accordingly, any mutual interference between crystal blanks 2 and 3 encapsulated within the same single container 1 can be prevented so as to maintain their adequate oscillating performances. Furthermore, since grounding electrodes 16 connected to metallic covers 7 are arranged for the respective mounting electrodes, a shielded container as a whole can be formed while preventing any electromagnetic coupling among the mounting electrodes, so as to further prevent occurrence of the mutual interference. Noise of respective oscillators per se containing therein crystal blanks 2 and 3, respectively, can be reduced.

Furthermore, in this embodiment, after tuning fork type crystal blank 2 and crystal blank 3 of AT cut are temporarily bonded to the bottom faces of recesses 1A and 1B by means of conductive adhesive 12 before being hardened, the entirety is heated to harden the conductive adhesive. Thus, compared with the conventional art in which the conductive adhesive is individually hardened by heating, the manufacturing process of the multifunctional crystal unit can be shortened by the present invention.

Figure 6A:
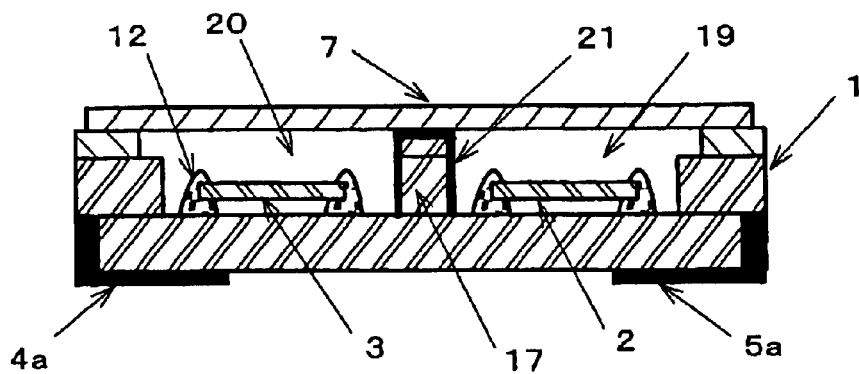
FIG. 6A is a cross-sectional view of a crystal unit according to a third embodiment of the present invention.
Figure 6B:
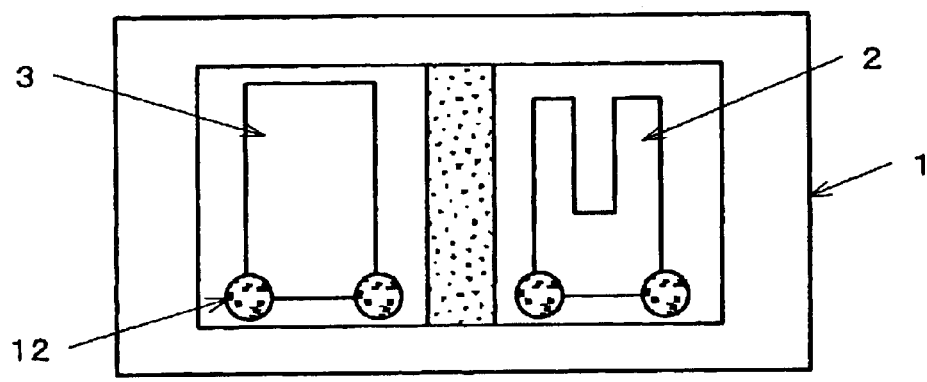
FIG. 6B is a plan view of the crystal unit of the third embodiment, illustrating a state where a metallic cover and a metallic ring are removed.
Figure 6C:
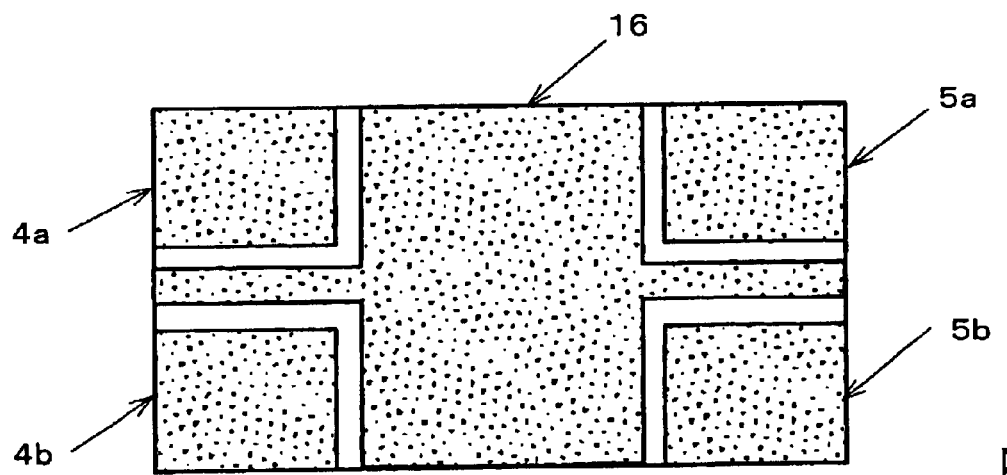
FIG. 6C is a bottom plan view of the crystal unit of the third embodiment.

Now, a multifunctional crystal unit according to the third embodiment of the present invention will be described with reference to FIGS. 6A through 6C. In the avobe-described first and second embodiments, although tuning fork type crystal blank 2 and crystal blank 3 of AT cut are arranged in a vertical direction within container 1, crystal blanks 2 and 3 are horizontally arranged in the third embodiment. Container 1 constituted of laminated ceramics is partitioned, at its central region, by projecting portion 17 so that, on both sides of projecting portion 17, first and second housing portions 19 and 20 are provided as recesses, respectively. Projecting portion 17 is formed with a metallic thin film in its outer surface, by metalizing to form shielding layer 21 that is a metal body. Metallic cover 7 is provided for entirely covering these housing portions 19 and 20, and shielding layer 21 in the surface of projecting portion 17 is disposed to come as close as possible to metallic cover 7. For example, a part of metallic cover 7 may be welded to shielding layer 17 by spot welding. The extending electrodes formed in both ends of the fork base portion of tuning fork type crystal blank 2 are fixedly bonded to a pair of terminal electrodes provided in the bottom face of first housing portion 19 by means of conductive adhesive 12, so that tuning fork type crystal blank 2 is held and housed in first housing portion 19. Similarly, the extending electrodes formed in opposite ends of one side of crystal blank 3 of AT cut are fixedly bonded to a pair of terminal electrodes provided in the bottom face of second housing portion 20 by means of conductive adhesive 12, so that crystal blank 3 of AT cut is held and housed in second housing portion 20.

An open face of container 1 is sealed by connecting metallic cover 7 to metallic ring 6 by seam welding, as described before. Also, in the outer face of container 1, a pair of mounting electrodes 5a and 5b connected to the excitation electrodes of tuning fork type crystal blank 2, and a pair of mounting electrodes 4a and 4b connected to the excitation electrodes of crystal blank 3 of AT cut are arranged. Grounding electrodes 16, which mutually electrically shield the mounting electrodes and are connected to shielding layer 21 of projecting portion 17, are formed in the outer bottom face of container 1.

In the crystal unit having the above-described constitution, similarly to that of the first embodiment, shielding layer 21 of projecting portion 17 provides an electrical shielding among especially, the excitation electrodes of tuning fork type crystal blank 2 and crystal blank 3 of AT cut. Also, grounding electrode 16 provides an electrical shielding among respective mounting electrodes. In conclusion, mutual interference between the crystal unit of AT cut and the tuning fork type crystal unit within container 1 can be prevented, and thus the oscillation of both crystal units can be well maintained.

Although several preferred embodiments of the present invention have been described, it should be noted that the present invention is not limited to the above-described embodiments. The above-described crystal unit houses therein crystal blanks and is connected to the externally arranged oscillating circuit. Nevertheless, it is possible to house the latter oscillating circuit per se in addition to the crystal blanks within container 1.

Figure 7:
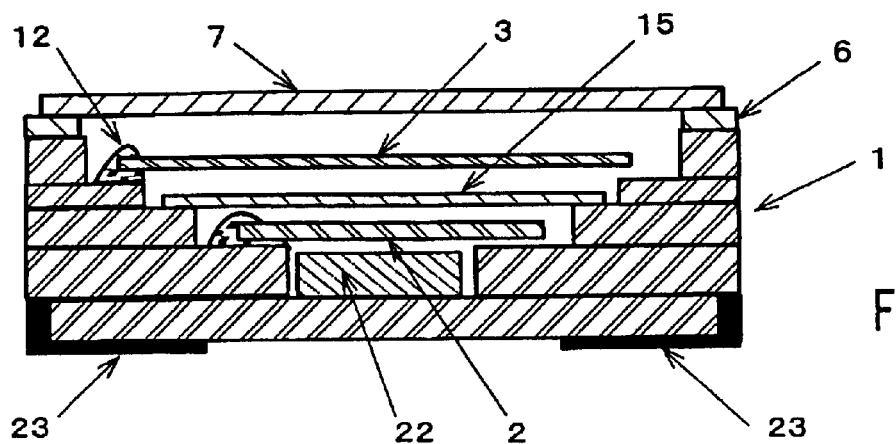
FIGS. 7 through 11 are cross-sectional views of crystal units to which the present invention is applied, respectively.

One illustrated in FIG. 7 corresponds to the crystal unit as illustrated in FIG. 4, except that in the inner bottom face of container 1, an additional stepped portion is provided, and in a recess formed by the additional stepped portion, IC (integrated circuit) chip 22 in which an oscillating circuit is integrated, is fixedly bonded. IC chip 22 is electrically connected to crystal blanks 2 and 3 by means of conductive patterns within container 1, and forms oscillating closed loops including crystal blanks 2 and 3 so as to output oscillating signals. In this case, mounting electrodes 23 provided in the outer bottom face of container 1 act as power supply, ground and oscillation output terminals for the oscillating circuit.

Figure 8:
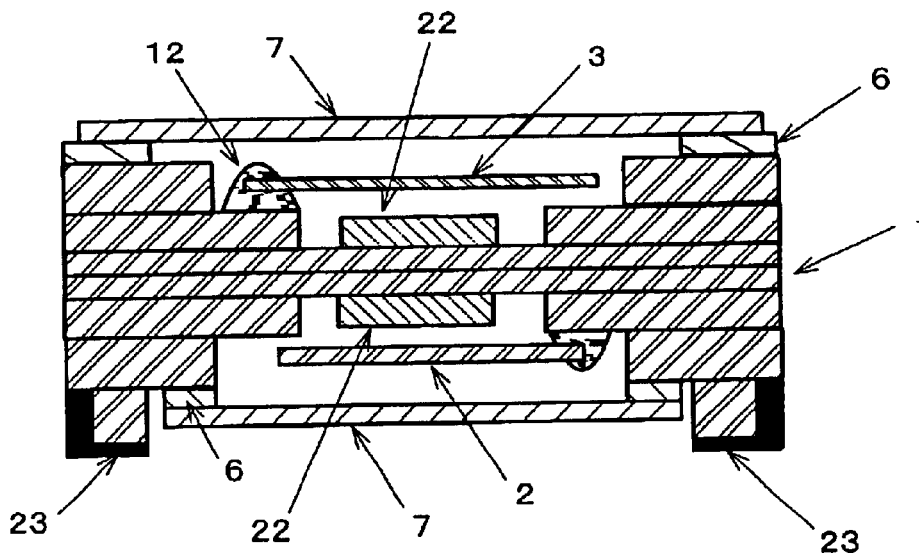

Similarly, one illustrated in FIG. 8 corresponds to the crystal unit as illustrated in FIG. 5 except that in the bottom faces of respective recesses 1A and 1B, additional stepped portions are provided, respectively, and in the recesses formed by these stepped portions, IC chips 22 in which oscillating circuits are integrated, are disposed, respectively. IC chip 22 provided in recess 1A is connected to tuning fork type crystal blank 2 and contains therein an oscillating circuit in association with crystal blank 2. Similarly, IC chip 22 provided in recess 1B is connected to crystal blank 3 of AT cut and contains therein an oscillating circuit in association with crystal blank 3. Since IC chips 22 per se are able to function as shielding layers, no shielding layer consisting of a metalized layer is required to be provided in the partition wall region partitioning the spaces containing respective crystal blanks 2 and 3.

Figure 9:
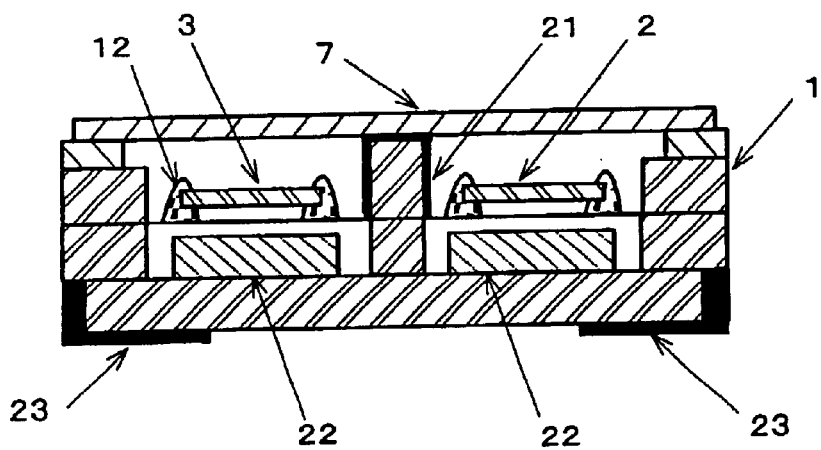

One illustrated in FIG. 9 corresponds to the crystal unit as illustrated in FIG. 6 except that in the inner bottom faces of respective housing portions 19 and 20, additional stepped portions are provided, and in the recesses defined by these additional stepped portions, IC chips 22 in which oscillating circuits are integrated are disposed. IC chip 22 within first housing portion 19 corresponds to tuning fork type crystal blank 2 and IC chip 22 within second housing portion 20 corresponds to crystal blank 3 of AT cut.

With the above-described examples, although a recess is provided in container 1, so that IC chips 22 are disposed within the recess, it may be possible to adopt a constitution such that without providing the recess, IC chips are provided in the same planar plane as respective crystal blanks 2 and 3 so as to reduce the dimension of height of the entire container.

IC chip 22 in which the oscillating circuit is integrated may be mounted on the outer wall of container 1.

Figure 10:
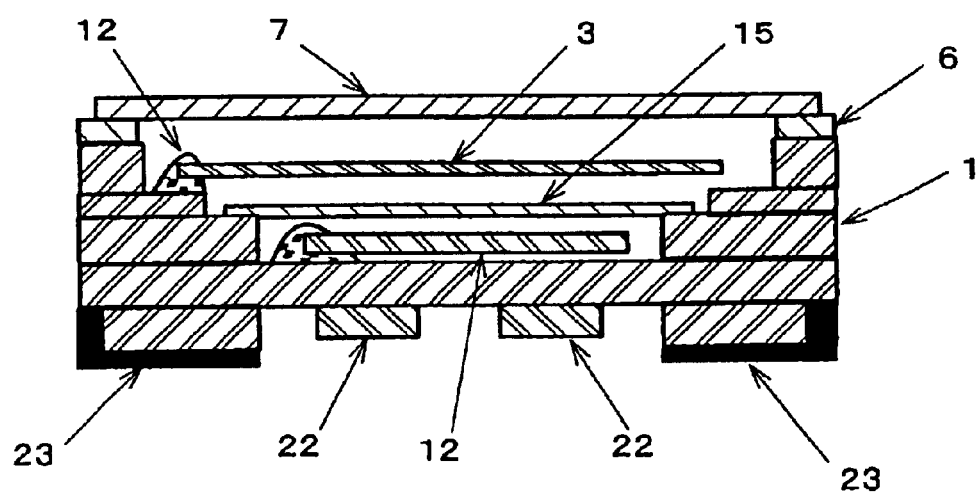

One illustrated in FIG. 10 corresponds to the crystal unit as illustrated in FIG. 4 except that a projecting portion is provided along the periphery of the outer bottom face of container 1 to thereby form the cross sectional shape of container 1 into the shape of H-letter, and in a newly formed recess in the bottom face, IC chips 22 are disposed. Mounting electrodes 23 are formed in the surface of the projecting portion.

Figure 11:
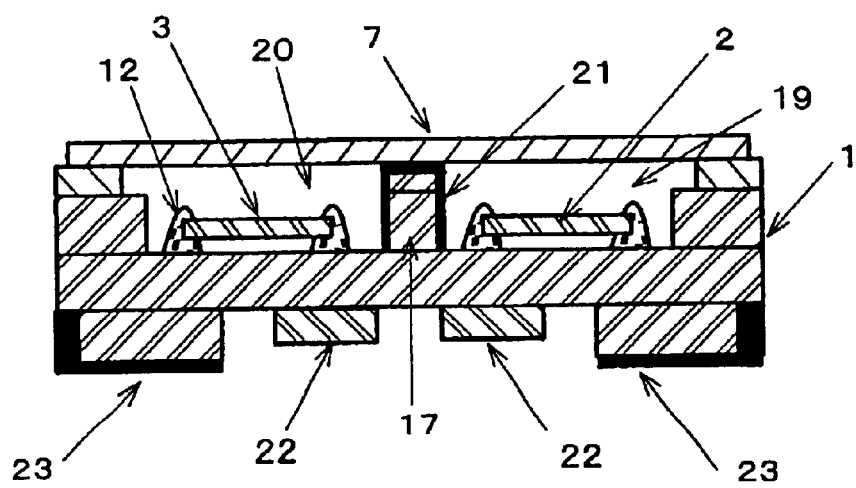

Similarly, one illustrated in FIG. 11 corresponds to the crystal unit as illustrated in FIG. 6 except that a projecting portion is provided along the periphery of the outer bottom face of container 1 to thereby form the cross sectional shape of container 1 into the shape of H-letter and in a newly formed recess in the bottom face, IC chips 22 are disposed.

Thus, it should be understood that those in which IC chips containing therein oscillating circuits are either housed in a container or disposed at the outer wall of the container so as to constitute a crystal oscillator are included in the technical scope of the present invention.

Further, in the above description, although the open face of container 1 is provided with metallic ring 6 to which metallic cover 7 is bonded by seam welding to thereby tightly seal the container, for example, either beam welding may be employed or the hermetic sealing may be achieved by glass or resin without provision of metallic ring 6. However, from the viewpoint of forming a shielded container, seam welding and beam welding are adequate. Further, in place of metallic ring 6, metallic film may be adopted. In short, a constitution should be employed in which either the seam welding or the beam welding may be applied.

Furthermore, although the description of a multifunctional crystal unit in which as different kinds of crystal blanks, a tuning fork type crystal blank and a crystal blank of AT cut are encapsulated in a container to acquire both clock signal and communication frequency signal, for example, not a crystal blank of AT cut but a crystal blank of SC cut may be used. Moreover, crystal blanks of different vibration frequencies but of an identical vibration mode may be adopted and housed in a container. Namely, the present invention is applicable to the use in which either different communication frequencies are obtained by the employment of two crystal blanks of AT cut or different clock signals are obtained by the employment of two tuning fork type crystal blanks. However, the constitution of a multifunctional crystal unit in which a clock signal and a communication frequency signal are obtained, will be more general.

What is claimed is:

1. A multifunctional crystal unit comprising a plurality of crystal blanks hermetically encapsulated in a container constituted of a container body having therein a recess, and a cover, wherein respective of said crystal blanks are held in different spaces, and said different spaces are isolated from one another by a shielding member to thereby provide electric shielding between said respective crystal blanks and to prevent mutual electrical interference between said respective crystal blanks.

2. The crystal unit according to claim 1, wherein said shielding member comprises a metallic body.

3. The crystal unit according to claim 1, wherein said crystal blanks are arranged so as to superpose plate faces thereof one another to thereby be disposed in a vertical direction within said container.

4. The crystal unit according to claim 1, wherein said crystal blanks are arranged so as to array plate faces thereof to thereby be horizontally disposed within said container.

5. The crystal unit according to claim 1, wherein said plurality of crystal blanks comprise a crystal blank of AT cut and a running fork type crystal blank.

6. A multifunctional crystal unit comprising a plurality of crystal blanks hermetically encapsulated in a container constituted of a container body having therein a recess, and a cover, wherein respective of said crystal blanks are held in different spaces, and said different spaces are isolated from one another by a shielding member to thereby provide electric shielding between said respective crystal blanks, wherein IC chips are provided for the respective crystal blanks, each IC chip constituting an oscillation circuit with an oscillating closed loop including the corresponding crystal blank, and said IC chips are housed in the container.

7. The crystal unit according to claim 6, wherein said crystal blanks are arranged so as to superpose plate faces thereof one another to thereby be disposed in a vertical direction within said container.

8. The crystal unit according to claim 6, wherein said crystal blanks are arranged so as to array plate faces thereof to thereby be horizontally disposed within said same container.

9. The crystal unit according to claim 6, wherein said plurality of crystal blanks comprise a crystal blank of AT cut and a tuning fork type crystal blank.

10. A multifunctional crystal unit comprising a plurality of crystal blanks hermetically encapsulated in a container constituted of a container body having therein a recess, and a cover, wherein respective of said crystal blanks are held in different spaces, and said different spaces are isolated from one another by a shielding member to thereby provide electric shielding between said respective crystal blanks, wherein IC chips are provided for the respective crystal blanks, each IC chip constituting an oscillation circuit with an oscillating closed loop including the corresponding crystal blank, and said IC chips are provided on an outer wall of the container.

11. The crystal unit according to claim 10, wherein said crystal blanks are arranged so as to superpose plate faces thereof one another to thereby be disposed in a vertical direction within said container.

12. The crystal unit according to claim 10, wherein said crystal blanks are arranged so as to array plate faces thereof to thereby be horizontally disposed within said same container.

13. The crystal unit according to claim 10, wherein said plurality of crystal blanks comprise a crystal blank of AT cut and a tuning fork type crystal blank.

14. A multifunctional crystal unit comprising first and second crystal blanks housed within a closed container constituted of a container body and a cover, wherein said container body has a cross section of an H shape and recesses formed in both primary planes thereof, while encapsulating in one recess said first crystal blank, and in the other recess said second crystal blank, said recesses being sealed, respectively, by the connection of a cover, and either one of said recesses having mounting electrodes in an end face thereof, and wherein a wall portion partitioning the one recess and the other recess has a shielding layer for providing electrical shielding between said first and second crystal blanks and for preventing mutual electrical interference between said first and second crystal blanks.

15. The crystal unit according to claim 14, wherein said first crystal blank comprises a thickness-shear mode crystal blank, and said second crystal blank comprises a tuning fork type crystal blank.

16. The crystal unit according to claim 14, wherein said first crystal blank comprises a crystal blank of AT cut.

17. The crystal unit according to claim 14, wherein in an inner face of either one of said recesses, a stepped portion to which said cover is connected, is provided.

18. A multifunctional crystal unit comprising first and second crystal blanks housed within a closed container constituted of a container body and a cover, wherein said container body has a cross section of an H shape and recesses formed in both primary planes thereof, while encapsulating in one recess said first crystal blank, and in the other recess said second crystal blank, said recesses being sealed, respectively, by the connection of a cover, and either one of said recesses having mounting electrodes in an end face thereof, wherein a first IC chip constituting an oscillation circuit with an oscillating closed loop including the first crystal blank is provided in the one recess, and a second IC chip constituting another oscillation circuit with another oscillating closed loop including the second crystal blank is provided in the other recess.

19. The crystal unit according to claim 18, wherein said first crystal blank comprises a crystal blank of AT-cut, and said second crystal blank comprises a tuning fork type crystal blank.

20. The crystal unit according to claim 18, wherein in an inner face of either one of said recesses, a stepped portion to which said cover is connected, is provided.

21. The crystal unit according to claim 18, wherein a wall portion partitioning the one recess and the other recess has a shielding layer for proving electrical shielding between said first and second crystal blanks.

22. A method of manufacturing a crystal unit, comprising:

providing a container body having a cross section thereof in an H shape, recesses in both primary planes thereof, and mounting electrodes in an end face of either one of said recesses;

encapsulating a first crystal blank in one recess in said both primary planes and a second crystal blank in the other recess;

adjusting vibration frequencies of said first and second crystal blanks; and thereafter, sealing said recesses in said both primary planes of said container body with respective covers for providing electrical shielding between said first and second crystal blanks and for preventing mutual electrical interference between said first and second crystal blanks.

* * * * *